US009893065B2

(12) United States Patent
Kanno et al.

(10) Patent No.: US 9,893,065 B2
(45) Date of Patent: Feb. 13, 2018

(54) SEMICONDUCTOR INTEGRATED CIRCUIT

(71) Applicant: FUJI ELECTRIC CO., LTD., Kawasaki (JP)

(72) Inventors: Hiroshi Kanno, Matsumoto (JP); Hitoshi Sumida, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/416,514

(22) Filed: Jan. 26, 2017

(65) Prior Publication Data

US 2017/0141114 A1 May 18, 2017

Related U.S. Application Data

(63) Continuation of application No. PCT/JP2015/006497, filed on Dec. 28, 2015.

(30) Foreign Application Priority Data

Feb. 18, 2015 (JP) .................................. 2015-029490

(51) Int. Cl.
*H01L 27/148* (2006.01)
*H01L 29/80* (2006.01)
(Continued)

(52) U.S. Cl.
CPC .......... *H01L 27/0928* (2013.01); *H01L 21/76* (2013.01); *H01L 21/8238* (2013.01); *H01L 29/0623* (2013.01); *H01L 29/0649* (2013.01)

(58) Field of Classification Search
CPC ............. H01L 21/8228; H01L 21/8232; H01L 27/0218; H01L 27/0251; H01L 27/0262; H01L 27/0274; H01L 27/0277; H01L 27/0296; H01L 29/0646; H01L 29/0623; H01L 29/0626; H01L 29/0638; H01L 29/1075; H01L 29/66022; H01L 29/66893; H01L 29/735
(Continued)

(56) References Cited

U.S. PATENT DOCUMENTS

2002/0118059 A1   8/2002   Ido
2003/0218186 A1  11/2003   Hano
(Continued)

FOREIGN PATENT DOCUMENTS

JP          58-210676        12/1983
JP          63-94667          4/1988
(Continued)

OTHER PUBLICATIONS

International Search Report dated Feb. 23, 2016 in corresponding International Application No. PCT/JP2015/006497.
(Continued)

*Primary Examiner* — Hsien Ming Lee

(57) ABSTRACT

A semiconductor integrated circuit includes a first well region of a first conductivity type; a second well region of a second conductivity type provided in an upper part of the first well region; a current suppression layer of the first conductivity type provided in a lower part of the semiconductor substrate immediately below the first well region, separated from the first well region; and an isolation region of the second conductivity type provided in an upper part of the semiconductor substrate, separated from the first well region, a reference potential being applied to the isolation region. The semiconductor substrate is the second conductivity type.

18 Claims, 10 Drawing Sheets

(51) Int. Cl.
  *H01L 29/94* (2006.01)
  *H01L 27/092* (2006.01)
  *H01L 21/76* (2006.01)
  *H01L 21/8238* (2006.01)
  *H01L 29/06* (2006.01)

(58) Field of Classification Search
  USPC ................ 257/223, 229, 274, 338, 339, 356
  See application file for complete search history.

(56) References Cited

U.S. PATENT DOCUMENTS

2008/0272440 A1* 11/2008 Hatade .................. H01L 21/761
                                                          257/372
2015/0021711 A1    1/2015  Jonishi

FOREIGN PATENT DOCUMENTS

| JP | 2002-252969 | 9/2002 |
| JP | 2004-47937 | 2/2004 |
| JP | 2006-66439 | 3/2006 |
| JP | 2006-319056 | 11/2006 |
| JP | 2009-21622 | 1/2009 |
| JP | 2009-302325 | 12/2009 |
| WO | WO 2014/058028 A1 | 4/2014 |

OTHER PUBLICATIONS

International Preliminary Report on Patentability dated Aug. 31, 2017 in corresponding International Patent Application No. PCT/JP2015/006497.

* cited by examiner

SEMICONDUCTOR INTEGRATED CIRCUIT

INCORPORATION BY REFERENCE

This application is a Continuation of International Application No. PCT/JP2015/006497 filed on Dec. 28, 2015, which claims benefit of priority to Japanese Patent Application No. 2015-029490 filed on Feb. 18, 2015. The contents of these applications are incorporated herein by reference in their entirety.

BACKGROUND OF THE INVENTION

1. Field of the Invention

The present invention relates to semiconductor integrated circuits, and more particularly, to techniques that can be effectively applied to semiconductor integrated circuits including driving circuits with CMOS structure.

2. Description of the Related Art

In general, switching elements of power-conversion bridge-circuits are driven by a high voltage IC (HVIC) in a low-capacity inverter. In general, the high voltage IC includes, for example, a high-side driving circuit, a low-side driving circuit, a level shifter, and a control circuit. The high voltage IC transmits driving signals for turning on and off a gate of a switching element from output terminals according to signals fed from input terminals. In the power-conversion bridge-circuit, the switching elements of high-side circuits which receive signals from the high voltage IC are operated to perform power conversion.

The high-side driving circuit which drives the high-side circuit is a complementary MOS (CMOS) circuit in which a p-channel MOSFET and an n-channel MOSFET as insulated-gate field-effect transistors are connected in a complementary topology. The p-channel MOSFET is disposed in an n-type well region which is provided in an upper part of the p-type semiconductor substrate. The n-channel MOSFET is disposed in a p-type well region which is provided in an upper part of the n-type well region. The high-side driving circuit operates, using a VS-potential as a reference potential and a VB-potential as a power-supply potential, and transmits a driving signal from an output terminal on the basis of a signal received from the level shift circuit. The VB-potential is the highest potential applied to the high voltage IC and is held at a level that is about 15 V higher than the VS-potential by, for example, a bootstrap capacitor in a normal state being not affected by noise. The VS-potential is potential at an output node portion which is a connection point between a high-voltage-side switching element and a low-voltage-side switching element of the power-conversion bridge-circuit and is changed between 0 V and several hundreds of volts during a power conversion process. In some cases, the VS-potential is a negative potential.

In the high voltage IC, various types of noise generated by the operation of the switching elements are likely to be fed. Therefore, improving noise immunity such that an operation error or an operation failure does not occur and ensuring high reliability are important in the design of the HVIC. Suppressing the operation of a parasitic element is necessary in order to improve noise immunity. In particular, suppressing the operation of a parasitic element, which is generated immediately below a high-side circuit formation region, which corresponds to a region in the vicinity of a high-voltage-side switching element driving circuit, in the vertical direction of the substrate, is important. The reason is that the area of the parasitic element provided in the vertical direction of the substrate is large and a large amount of current is likely to flow.

JP 2004-47937 A discloses a technique in which an n-type high-concentration buried region is provided between a p-type semiconductor substrate and an n-type semiconductor layer to suppress the operation of a parasitic p-n-p transistor. WO 2014/058028 A discloses a technique in which a clamping p-channel MOSFET is provided in an n-type well region to suppress the operation of a parasitic p-n-p bipolar transistor due to a negative voltage surge.

SUMMARY OF THE INVENTION

An object of the invention is to provide a technique that can improve the reliability of semiconductor integrated circuits.

In order to achieve the object, an aspect of the semiconductor integrated circuit according to the present invention includes: a first well region of a first conductivity type; a second well region of a second conductivity type provided in an upper part of the first well region; a current suppression layer of the first conductivity type provided in a lower part of a semiconductor substrate immediately below the first well region, separated from the first well region; and an isolation region of the second conductivity type provided in an upper part of the semiconductor substrate, separated from the first well region, a reference potential being applied to the isolation region. The semiconductor substrate is the second conductivity type.

These and/or other objects and new characteristics of the invention will become apparent from the following description of the specification and the accompanying drawings.

DETAILED DESCRIPTION OF THE INVENTION

Figure 1:
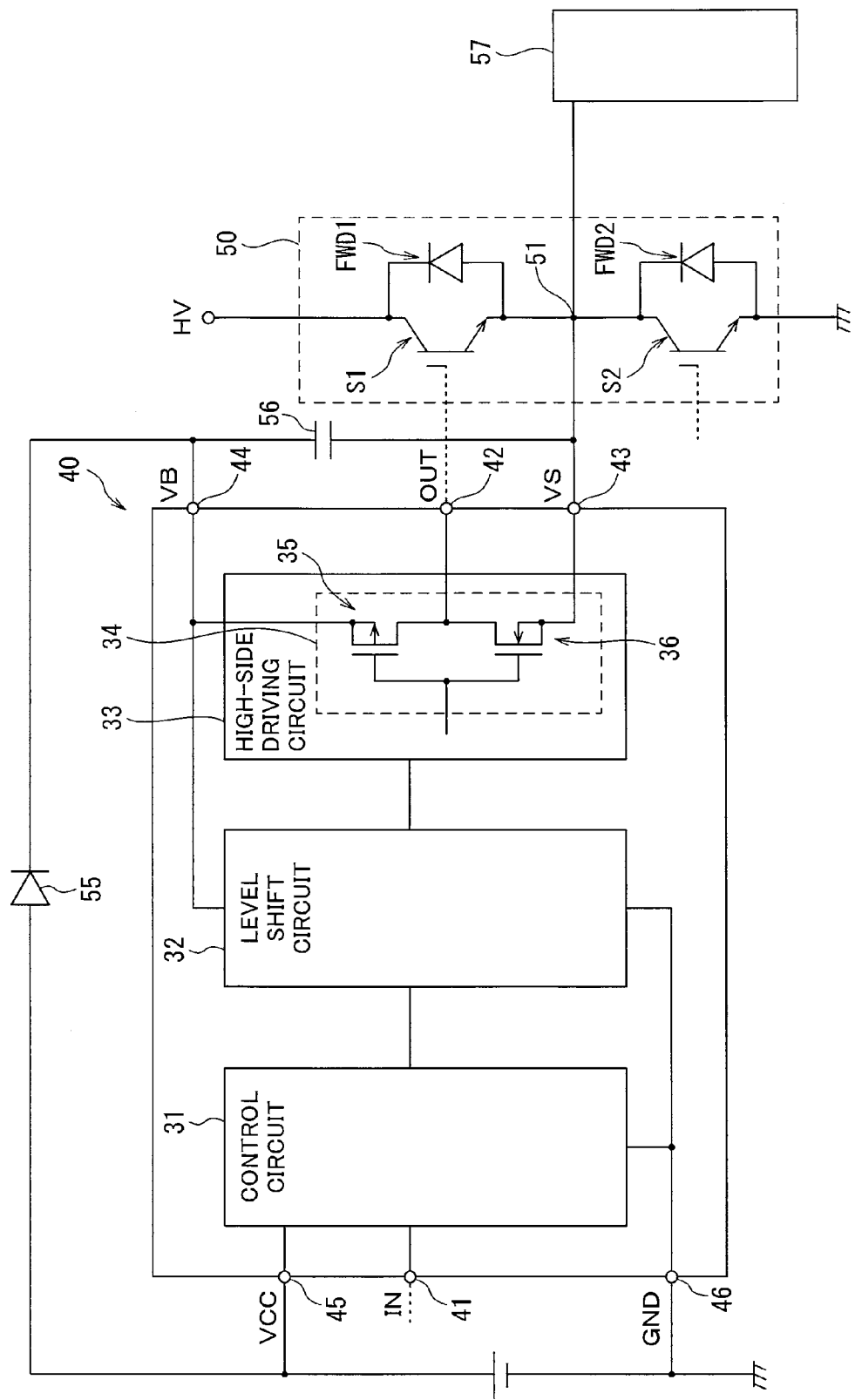
FIG. 1 is a circuit diagram schematically illustrating the structure of a semiconductor integrated circuit according to a first embodiment of the present invention.

Hereinafter, semiconductor integrated circuits according to first to fourth embodiments of the invention will be described in detail with reference to the drawings.

In the specification, a "first main electrode region" is assigned to a semiconductor region which will be a source region or a drain region in a field-effect transistor (FET) or a static induction transistor (SIT), an emitter region or a collector region in an insulated-gate bipolar transistor (IGBT) and an anode region or a cathode region in a static induction thyristor (SI Thy) or a gate turn-off thyristor (GTO). A "second main electrode region" is assigned to a semiconductor region which will not be the first main electrode region and will be the source region or the drain region in the FET or the SIT, the emitter region or the collector region in the IGBT, and the anode region or the cathode region in the SI thyristor or the GTO. That is, when the first main electrode region is the source region, the second main electrode region means the drain region. When the first main electrode region is the emitter region, the second main electrode region means the collector region. When the first main electrode region is the anode region, the second main electrode region means the cathode region. In the following first to fourth embodiments, the description is focused on power ICs implemented by insulated-gate field-effect transistors. Therefore, the source region is referred to as the "first main electrode region" and the drain region is referred to as the "second main electrode region".

In the following first to fourth embodiments, an example in which a first conductivity type is assigned to an n type and a second conductivity type is assigned to a p type will be described. However, the relationship between the conductivity types may be reversed such that the first conductivity type is a p type and the second conductivity type is an n type. In the specification and the accompanying drawings, in the layers or regions having "n" or "p" appended thereto, an electron or a hole means a majority carrier. In addition, symbols "+" and "−" added as superscripts to n or p mean that the impurity concentration of a semiconductor region is higher and lower than that of a semiconductor region without the symbols. In the following description, the terms "top" and "bottom" in, for example, "top surface" and "bottom surface" are defined depending on cross-sectional views. For example, when the direction of a semiconductor integrated circuit is changed by 90° and is then observed, the terms "top" and "bottom" change to "left" and "right", respectively. When the direction of the semiconductor integrated circuit is changed by 180° and is then observed, the terms "top" and "bottom" are reversed.

In the description of the following first to fourth embodiments and the accompanying drawings, the same components are denoted by the same reference numerals and the description thereof will not be repeated. In addition, in the accompanying drawings described in the following first to fourth embodiments, for ease of viewing or understanding, a scale and a dimensional ratio are different from the actual scale and dimensional ratio. The invention is not limited to the following first to fourth embodiments as long as it does not depart from the scope and spirit thereof.

First Embodiment

As illustrated in FIG. 1, a semiconductor integrated circuit 40 according to a first embodiment of the present invention is a power IC including, for example, a control circuit 31, a level shift circuit 32, a high-side driving circuit 33, and a low-side driving circuit, although the illustration of the low-side driving circuit is not omitted. In addition, the semiconductor integrated circuit 40 according to the first embodiment is a high voltage power IC that drives a power converter 50 corresponding to, for example, one phase of a power-conversion bridge-circuit. The semiconductor integrated circuit 40 according to the first embodiment turns on and off a gate of a switching element implementing the power converter 50 and transmits a driving signal from an output terminal 42, in response to a signal fed from an input terminal 41.

As illustrated in FIG. 1, in the power converter 50, a high-voltage-side switching element S1 and a low-voltage-side switching element S2 are connected in series to implement a high-side circuit. The high-voltage-side switching element S1 and the low-voltage-side switching element S2 are, for example, active elements such as IGBTs. A freewheeling diode FWD1 is connected in parallel to the high-voltage-side switching element S1, and a freewheeling diode FWD2 is connected in parallel to the low-voltage-side switching element S2, in a reverse direction, respectively.

The high-voltage-side switching element S1 and the low-voltage-side switching element S2 are connected in series between a high-voltage main power supply HV at the positive electrode side and a ground (GND) potential at the negative electrode side against to the main power supply HV. A VS-terminal 43 to which a VS-potential is applied as a second potential is connected to a connection point 51 between the high-voltage-side switching element S1 and the low-voltage-side switching element S2. The connection point 51 is an output point of the power converter 50 corresponding to one phase of the power-conversion bridge-circuit. The low-voltage-side switching element S2 is connected between the connection point 51 and the GND potential. For example, a motor is connected as a load 57 to the connection point 51.

While the semiconductor integrated circuit 40 is operating, the VS-potential applied to the VS-terminal 43 is repeatedly raised and dropped across the high-side-potential of the main power supply HV (for example, about 400 V) and the low-potential-side potential, corresponding to GND potential, by the complementary turn-on and turn-off operations of the high-voltage-side switching element S1 and the low-voltage-side switching element S2 implementing the high-side circuit, so that the VS-potential can change from 0 V to several hundreds of volts.

The high-side driving circuit 33 includes a gate driving circuit 34. The gate driving circuit 34 is, for example, a CMOS circuit in which an n-channel MOSFET 36 as a first-conductivity-type-channel first field-effect transistor which is an active element and a p-channel MOSFET 35 as a second-conductivity-type-channel second field-effect transistor which is an active element are connected in series to each other in the complementary topology. Hereinafter, n-channel MOSFET may be referred as 'nMOS' and p-channel MOSFET is referred as 'pMOS'. Specifically, a source of the pMOS 35 is connected to the VB-terminal 44 and a drain of the pMOS 35 is connected to a drain of the nMOS 36. A source of the nMOS 36 is connected to the VS-terminal 43.

The gate driving circuit 34 operates with the VS-potential applied to the VS-terminal 43 as a reference potential and the VB-potential which is applied to the VB-terminal 44 as a first potential. While the first potential serves as a power-supply potential, the gate driving circuit 34 transmits a driving signal from the output terminal 42, in accordance with a signal received from the level shift circuit 32, for driving the high-voltage-side switching element S1.

The control circuit 31 operates with the GND potential applied to a ground (GND) terminal 46 as the reference potential and a VCC potential applied to a VCC-terminal 45 as the power-supply potential. The control circuit 31 generates a low-side-level on/off signal for turning on and off the high-voltage-side switching element S1, and further, the control circuit 31 generates a low-side-level on/off signal for turning on and off the low-voltage-side switching element S2. The GND potential is a common potential.

The level shift circuit 32 converts the low-side-level on/off signal generated by the control circuit 31 into a high-side-level on/off signal.

In the semiconductor integrated circuit 40 according to the first embodiment, when the high-voltage-side switching element S1 is scheduled to be driven, in the beginning, the control circuit 31 generates the low-side-level on/off signal for turning on and off the high-voltage-side switching element S1. Then, the low-side-level on/off signal is converted into the high-side-level on/off signal by the level shift circuit 32 and the high-side-level on/off signal is fed to the high-side driving circuit 33.

The on/off signal which is fed from the control circuit 31 to the high-side driving circuit 33 is transferred to a gate of the high-voltage-side switching element S1 through the gate driving circuit 34. The high-voltage-side switching element S1 is turned on and off on the basis of the on/off signal from the control circuit 31.

A bootstrap diode 55 which is an external element is connected to between the VCC-terminal 45 and the VB-terminal 44. In addition, a bootstrap capacitor 56 which is an external element is connected between the VB-terminal 44 and the VS-terminal 43. The bootstrap diode 55 and the bootstrap capacitor 56 generate power for driving the high-voltage-side switching element S1.

The VB-potential is the highest potential applied to the semiconductor integrated circuit 40 and is held at a level that is about 15 V higher than the VS-potential by the bootstrap capacitor 56 in a normal state in which the VB-potential is not affected by noise. The VS-potential is potential at the connection point 51, which corresponds to output node portion, between the high-voltage-side switching element S1 and the low-voltage-side switching element S2 of the power-conversion bridge-circuit, being changed between 0 V and several hundreds of volts during a power conversion process. In some cases, the VS-potential is a negative potential.

Next, the detailed structure of the semiconductor integrated circuit 40 according to the first embodiment will be described.

Figure 2:
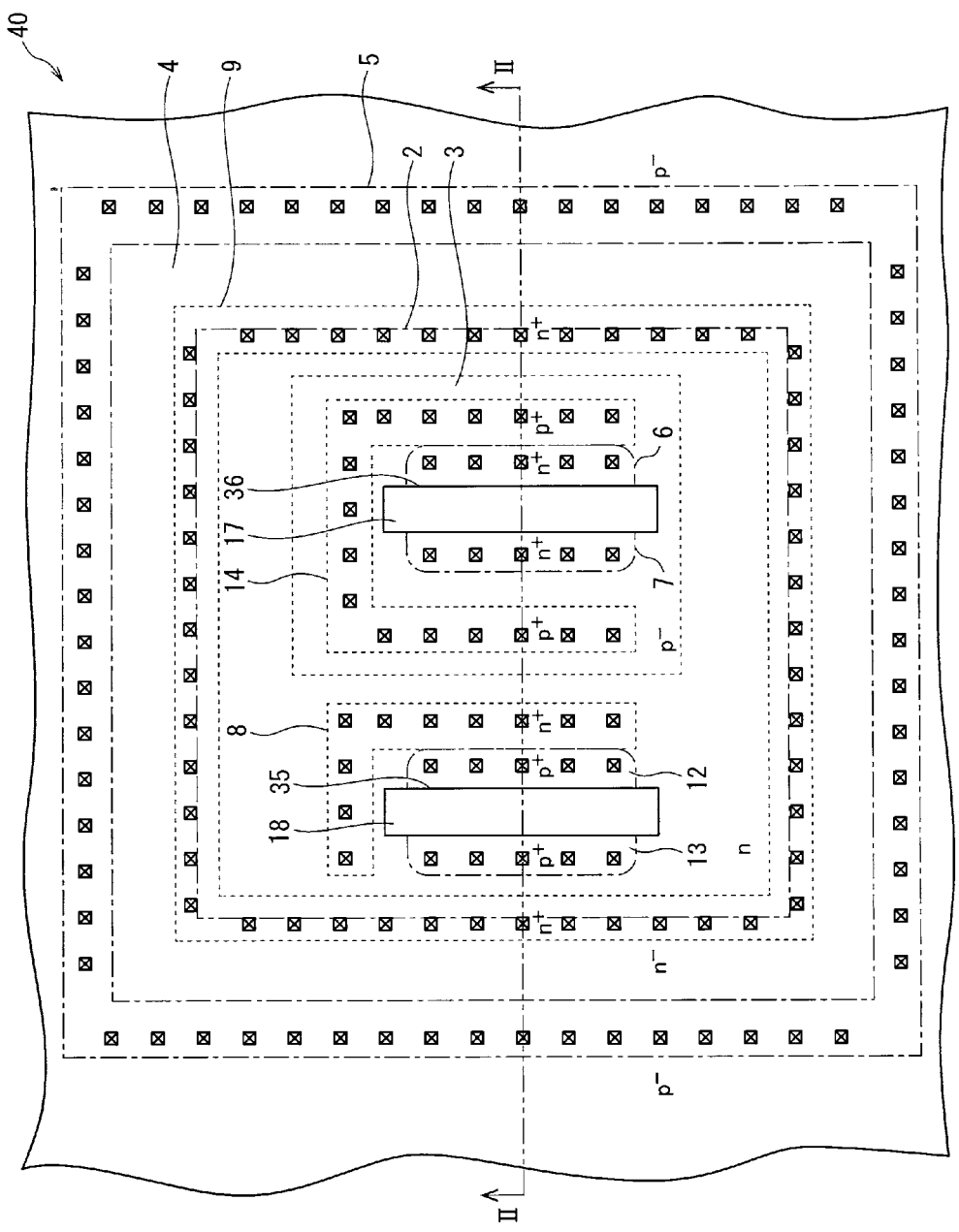
FIG. 2 is a plan view illustrating a main portion of the planar layout of each semiconductor region in a high-side driving-circuit forming-region of the semiconductor integrated circuit according to the first embodiment of the present invention.
Figure 3:
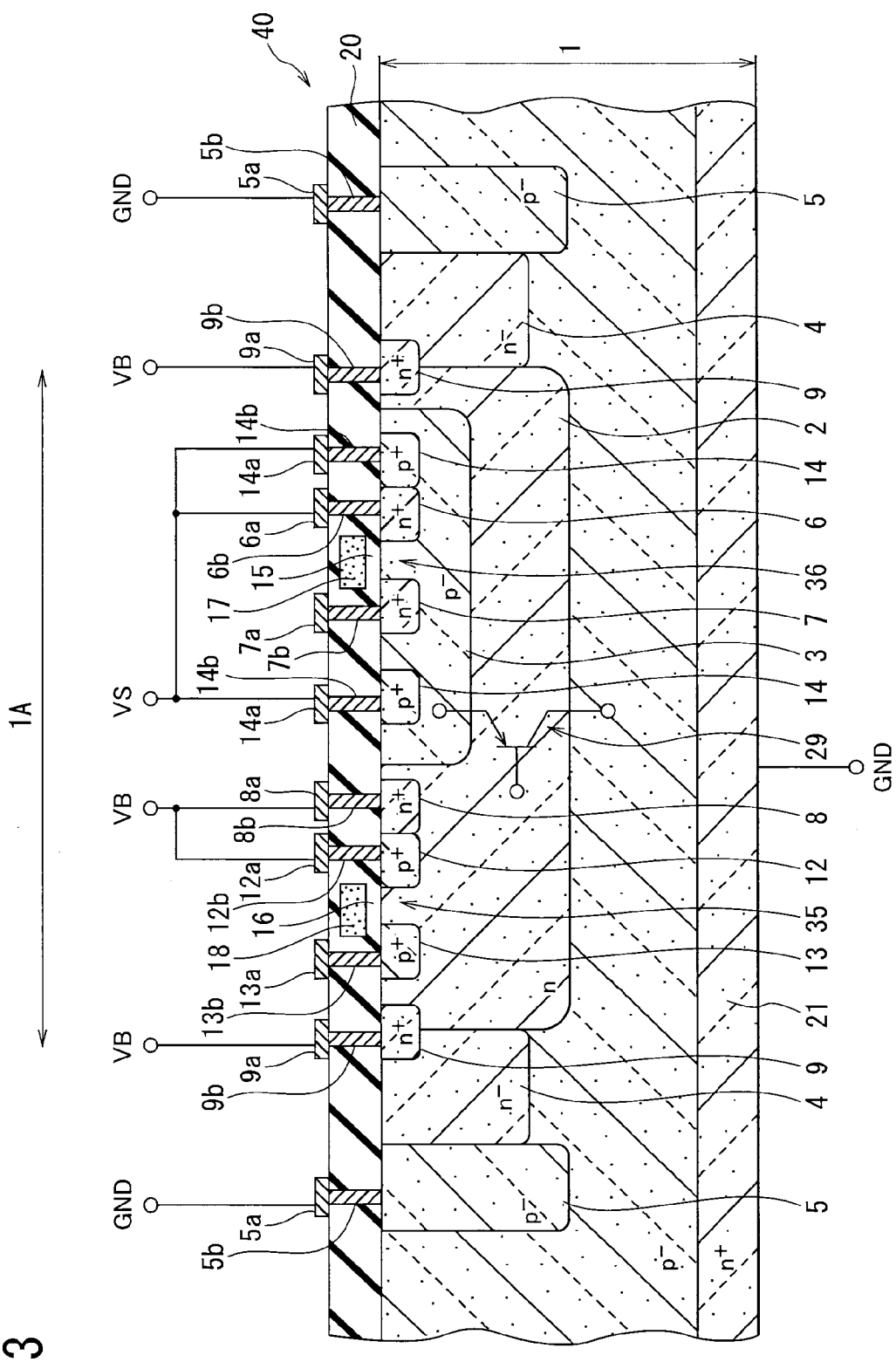
FIG. 3 is a cross-sectional view illustrating a main portion of a cross-sectional structure taken along the line II-II of FIG. 2.

As illustrated in FIG. 2 and FIG. 3, the semiconductor integrated circuit 40 according to the first embodiment is a power IC merged in a semiconductor substrate 1 of a second conductivity type (p⁻-type), in which an element isolation structure is fabricated by a self-isolated IC process. The semiconductor substrate 1 is, for example, a single-crystalline silicon substrate with a specific resistivity of about 100 Ωcm or more. The semiconductor substrate 1 may be implemented by a stacked structure including a semiconductor substrate and a semiconductor active-layer laminated on the semiconductor substrate.

As illustrated in FIG. 3, a first well region 2 of a first conductivity type (n-type) is selectively provided in an upper part, which corresponds to a portion of surface layer, that is close to a top surface which is a main surface of the semiconductor substrate 1 and a second well region 3 of the second conductivity type (p⁻-type) is selectively provided in an upper part of the first well region 2. In addition, a breakdown-voltage improving-region 4 of the first conductivity type (n⁻-type), which corresponds to well region, and an isolation region 5 of the second conductivity type (p⁻-type), which is formed as a well region, are selectively provided in the upper part of the semiconductor substrate 1. The first and second well regions 2 and 3 are provided in a high-side driving-circuit forming-region 1A of the semiconductor substrate 1. The first well region 2 is provided with an impurity concentration of, for example, about $1\times10^{14}/\text{cm}^3$ to $1\times10^{17}$ cm³. The second well region 3 is provided with an impurity concentration of, for example, about $1\times10^{14}/\text{cm}^3$ to $1\times10^{18}/\text{cm}^3$.

As illustrated in FIG. 2 and FIG. 3, the first well region 2 is surrounded by the breakdown-voltage improving-region 4 and comes into contact with the breakdown-voltage improving-region 4. The breakdown-voltage improving-region 4 is surrounded by the isolation region 5 and comes into contact with the isolation region 5. That is, the breakdown-voltage improving-region 4 is provided between the first well region 2 and the isolation region 5 and comes into contact with the first well region 2 and the isolation region 5. The breakdown-voltage improving-region 4 has a lower impurity concentration than the first well region 2. The isolation region 5 has a higher impurity concentration than the semiconductor substrate 1.

As illustrated in FIG. 3, the pMOS 35 is an active element that is provided in the upper part of the first well region 2. The nMOS 36 is an active element that is provided in the upper part of the second well region 3. The first well region 2 is an isolation region that electrically isolates the pMOS 35 from the semiconductor substrate 1 and the second well region 3 is an isolation region that electrically isolates the nMOS 36 from the first well region 2.

The pMOS 35 includes a channel formation region which is the first well region 2, a gate insulating film 16 which is selectively provided at the surface of the first well region 2 in the upper portion of the semiconductor substrate 1, and a gate electrode 18 which is provided over the channel formation region with the gate insulating film 16 interposed between the gate electrode 18 and the channel formation region. In addition, the pMOS 35 includes a first main electrode region 12 of the second conductivity type (p⁺-type) which is selectively provided in the upper part of the first well region 2 and a second main electrode region 13 of the second conductivity type (p⁺-type) which is selectively provided in the upper part of the first well region 2 such that the channel formation region is interposed between the first main electrode region 12 and the second main electrode region 13 and the second main electrode region 13 is separated from the first main electrode region 12. The first main electrode region 12 corresponds to the source region and the second main electrode region 13 corresponds to the drain region.

The nMOS 36 includes a channel formation region which is the second well region 3, a gate insulating film 15 which is selectively provided at the surface of the second well region 3 in the upper portion of the semiconductor substrate 1, and a gate electrode 17 which is provided over the channel formation region with the gate insulating film 15 interposed between the gate electrode 17 and the channel formation region. In addition, the nMOS 36 includes a first main electrode region 6 of the first conductivity type (n$^+$-type) which is selectively provided in the upper part of the second well region 3 and a second main electrode region 7 of the first conductivity type (n$^+$-type) which is selectively provided in the upper part of the second well region 3 such that the channel formation regions is interposed between the first main electrode region 6 and the second main electrode region 7 and the second main electrode region 7 is separated from the first main electrode region 6. The first main electrode region 6 corresponds to the source region and the second main electrode region 7 corresponds to the drain region.

The gate insulating films 15 and 16 are, for example, silicon dioxide films. The gate electrodes 17 and 18 are, for example, polysilicon films into which impurities for reducing a resistance value are doped. The first and second main electrode regions 12 and 13 of the pMOS 35 have a higher impurity concentration than the first well region 2. The first and second main electrode regions 6 and 7 of the nMOS 36 have a higher impurity concentration than the second well region 3.

Examples of the silicon dioxide film include a thermally oxidized film which is made by a thermal oxidation method and a deposited oxide film which is deposited by a chemical vapor deposition (CVD) method. Using the thermally oxidized film with highly densified structure as the gate insulating films 15 and 16 in the MOSFET is preferable. In the first embodiment, the MOSFET in which the gate insulating films 15 and 16 are silicon dioxide films is described. However, the transistor may be a MISFET in which the gate insulating film is a silicon nitride film or a stacked film of a silicon nitride film and a silicon oxide film.

As illustrated in FIG. 3, a first contact region 8 of the first conductivity type (n$^+$-type) which has a higher impurity concentration than the first well region 2 is selectively provided in the upper part of the first well region 2. A third contact region 9 of the first conductivity type (n$^+$-type) is selectively provided in the upper parts of the first well region 2 and the breakdown-voltage improving-region 4, spanning over the first well region 2 and the breakdown-voltage improving-region 4. The third contact region 9 has a higher impurity concentration than the first well region 2 and the breakdown-voltage improving-region 4. A second contact region 14 of the second conductivity type (p$^+$-type), which has a higher impurity concentration than the second well region 3, is selectively provided in the upper part of the second well region 3.

As illustrated in FIG. 3, an interlayer insulating film 20 is provided on the top surface of the semiconductor substrate 1 so as to cover the gate electrodes 17 and 18. A ground electrode 5a, a source electrode 6a, a drain electrode 7a, a first contact electrode 8a, a third contact electrode 9a, a source electrode 12a, a drain electrode 13a, and a second contact electrode 14a are provided on the interlayer insulating film 20. The electrodes 5a, 6a, 7a, 8a, 9a, 12a, 13a, and 14a are made of, for example, aluminum films.

As illustrated in FIG. 3, the ground electrode 5a is electrically connected to the isolation region 5 through a conductive plug 5b which is buried in the interlayer insulating film 20. The source electrode 6a is electrically connected to the first main electrode region 6 which corresponds to the source region through a conductive plug 6b buried in the interlayer insulating film 20. The drain electrode 7a is electrically connected to the second main electrode region 7 which corresponds to the drain region through a conductive plug 7b buried in the interlayer insulating film 20.

As illustrated in FIG. 3, the first contact electrode 8a is electrically connected to the first contact region 8 through a conductive plug 8b buried in the interlayer insulating film 20. The third contact electrode 9a is electrically connected to the third contact region 9 through a conductive plug 9b buried in the interlayer insulating film 20.

As illustrated in FIG. 3, the source electrode 12a is electrically connected to the first main electrode region 12 which corresponds to the source region through a conductive plug 12b buried in the interlayer insulating film 20. The drain electrode 13a is electrically connected to the second main electrode region 13 which corresponds to the drain region through a conductive plug 13b buried in the interlayer insulating film 20. The second contact electrode 14a is electrically connected to the second contact region 14 through a conductive plug 14b buried in the interlayer insulating film 20.

As can be seen from FIG. 1 and FIG. 3, the ground electrode 5a is electrically connected to the GND terminal 46 illustrated in FIG. 1 and the GND potential is applied to the ground electrode 5a through the GND terminal 46. The source electrode 6a and the second contact electrode 14a are electrically connected to the VS-terminal 43 illustrated in FIG. 1 and the VS-potential is applied to the source electrode 6a and the second contact electrode 14a through the VS-terminal 43. The first contact electrode 8a, the third contact electrode 9a, and the source electrode 12a are electrically connected to the VB-terminal 44 illustrated in FIG. 1 and the VB-potential is applied to the first contact electrode 8a, the third contact electrode 9a, and the source electrode 12a through the VB-terminal 44.

That is, the GND potential is applied as the reference potential to the isolation region 5. In addition, the VB-potential which is different from the GND potential is applied as the first potential to the first well region 2 and the breakdown-voltage improving-region 4 through the third contact region 9 which is provided across the first well region 2 and the breakdown-voltage improving-region 4 and the first contact region 8 provided in the first well region 2. The VS-potential which is different from the GND potential and the VB-potential is applied as the second potential to the second well region 3 through the second contact region 14. The VB-potential is applied to the first main electrode region 12 of the pMOS 35 and the VS-potential is applied to the first main electrode region 6 of the nMOS 36.

As illustrated in FIG. 2, the first contact region 8 has an L-shape in a plan view and is provided such that a first portion which extends along a gate width direction of the pMOS 35, which corresponds to the longitudinal direction of the gate electrode 18, comes into contact with the first main electrode region 12 of the pMOS 35, which corresponds to the source region, and a second portion which extends from the first portion along a gate length direction of the pMOS 35, which corresponds to the width direction of the gate electrode 18, is separated from the first main electrode region 12 and the second main electrode region 13 of the pMOS 35.

As illustrated in FIG. 2, the second contact region 14 has a U-shape in a plan view and is provided so as to surround the nMOS 36. The second contact region 14 is provided such that a first portion which extends in a gate width direction of the nMOS 36, which is defined as the longitudinal direction of the gate electrode 17, comes into contact with the first main electrode region 6 of the nMOS 36, which corresponds to the source region, and a second portion which extends from the first portion along a gate length direction of the nMOS 36, which is defined as the width direction of the gate electrode 17, and a third portion which extends from the second portion along a gate width direction of the nMOS 36 are separated from the first main electrode region 6 and the second main electrode region 7 of the nMOS 36.

The third contact region 9 has a ring-shaped plane pattern that extends in a ring shape so as to surround the pMOS 35 and the nMOS 36.

As illustrated in FIG. 3, a current suppression layer 21 of the first conductivity type (n$^+$-type) is provided in a lower part close to a bottom surface opposite to the main surface of the semiconductor substrate 1 so as to be separated from the first well region 2. The current suppression layer 21 is provided at the entire bottom surface of the semiconductor substrate 1 and faces the entire bottom of the first well region 2, although the detailed structure of the current suppression layer 21 is not illustrated in FIG. 3. That is, the semiconductor integrated circuit 40 according to the first embodiment includes the current suppression layer 21 which is provided at the bottom of the semiconductor substrate 1 immediately below the first well region 2 so as to be separated from the first well region 2. Therefore, a potential barrier is present between the first well region 2 and the bottom surface of the semiconductor substrate 1 due to a potential difference in a p-n junction interface between the semiconductor substrate 1 and the current suppression layer 21. A diffusion potential is generated in the p-n junction interface and the potential of the current suppression layer 21 is about 0.6 V—the value of "about 0.6 V" corresponds to the well-known diffusion potential of the p-n junction interface of silicon—higher than the substrate potential of a region between the first well region 2 and the current suppression layer 21, the region is made of the semiconductor substrate 1, even in a state in which no bias is applied. The current suppression layer 21 has a higher impurity concentration than the semiconductor substrate 1 and has an impurity concentration of, for example, about $1 \times 10^{14}$/cm$^3$ to $1 \times 10^{21}$/cm$^3$. The current suppression layer 21 is also separated from the breakdown-voltage improving-region 4 and the isolation region 5.

Figure 6:
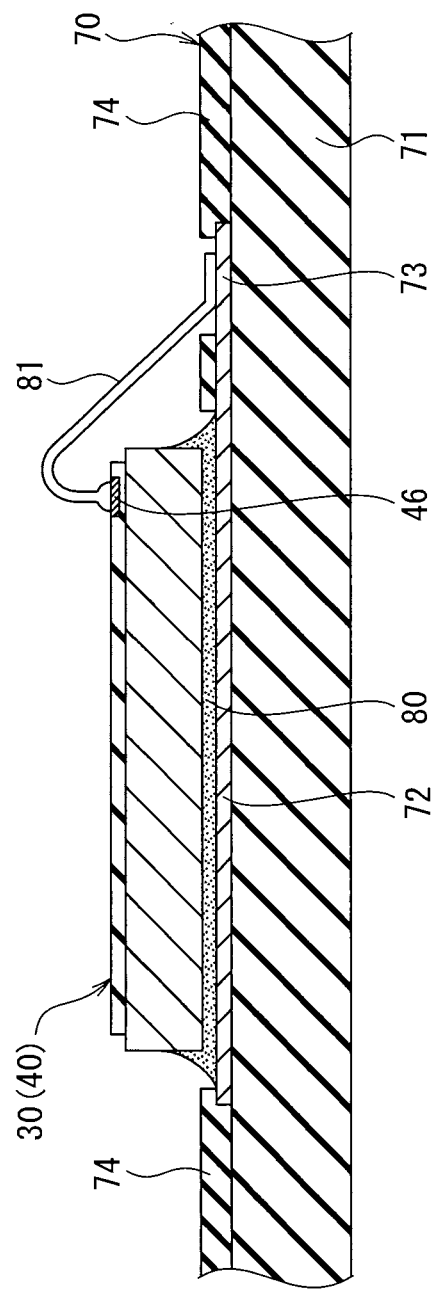
FIG. 6 is a cross-sectional view illustrating a main portion of a state in which the semiconductor integrated circuit according to the first embodiment of the present invention is mounted on a wiring substrate.

As illustrated in FIG. 6, as a semiconductor chip 30, the semiconductor integrated circuit 40 according to the first embodiment is mounted on a wiring substrate 70. The wiring substrate 70 includes a core base 71 which is made of an insulating material, such as ceramics, and a die pad 72 and a wire connection portion 73 which are provided on a top surface of the core base 71 and are made of a conductive metal material. The die pad 72 and the wire connection portion 73 are integrally merged and are electrically connected to each other. In addition, a protective film 74 which is made of an insulating material is provided on the top surface of the core base 71. The die pad 72 and the wire connection portion 73 are exposed through opening portions cut in the protective film 74.

The semiconductor chip 30 is bonded and fixed to the die pad 72 through an adhesive 80 which is made of, for example, conductive silver paste and is sandwiched between the bottom surface of the semiconductor substrate 1 and the top surface of the die pad 72. The GND terminal 46 is provided on the top surface of the semiconductor chip 30. The GND terminal 46 is electrically connected to the wire connection portion 73 through a bonding wire 81.

Although the illustration is omitted in FIG. 6, the GND potential is applied to the die pad 72 and the wire connection portion 73. As the GND potential is applied to the bottom surface of the semiconductor substrate 1, the GND potential can also be applied to the current suppression layer 21. The objective of the application of the GND potential to the bottom surface is to prevent the effect of the stray capacitance of the semiconductor chip 30 from affecting other semiconductor chips or circuits, after the semiconductor chip 30 is mounted on the wiring substrate 70, or to stabilize power-supply potential in the semiconductor chip 30.

The VB-potential of the first potential and the VS-potential of the second potential are applied so that the p-n junction interface between the first well region 2 and the second well region 3 can be reversely biased, during the normal operation of the semiconductor integrated circuit 40. The semiconductor integrated circuit 40 according to the first embodiment is manufactured by a self-isolated IC process. In the semiconductor integrated circuit 40 manufactured by the self-isolated IC process, as illustrated in FIG. 3, a parasitic p-n-p bipolar transistor 29 including the p$^-$-type second well region 3, the n-type first well region 2, and the p$^-$-type semiconductor substrate 1 is disposed in the high-side driving-circuit forming-region 1A. The base, emitter, and collector of the parasitic p-n-p bipolar transistor 29 are connected to the VB-terminal 44, the VS-terminal 43, and the GND terminal 46, respectively.

During the normal operation of the semiconductor integrated circuit 40, since the VB-potential as the power-supply potential is higher than the VS-potential, which serves as an intermediate potential, the parasitic p-n-p bipolar transistor 29 does not operate. However, the parasitic p-n-p bipolar transistor 29 is turned on when the VB-potential is lower than the VS-potential by 0.6 V, which is the diffusion potential of the p-n junction of silicon, or more due to a negative voltage surge, that is, if the following potential relationship is satisfied:

$$VB\text{-potential} < (VS\text{-potential} - 0.6 \text{ [V]}).$$

An undesirable case that the unrequired potential relationship is satisfied will be described with reference to FIG. 3. In the earlier semiconductor integrated circuit (for example, HVIC) according to the earlier technology, when the potential of the bottom surface of the semiconductor substrate 1 is fixed by the application of the GND potential, a large amount of current flows to a current path between the VS-terminal 43 to which the high voltage of the high-side circuit—the high-side-potential of HV—is applied and the GND terminal 46. That is, because a large amount of current flows through a current path from the second well region 3 to the bottom surface of the semiconductor substrate 1, an operation error or an operation failure occurs in the semiconductor integrated circuit 40 due to the generation of heat caused by the large amount of current, and therefore, the reliability is deteriorated in the earlier semiconductor integrated circuit.

Here, the reason why a large amount of current flows to the current path from the second well region 3 to the bottom surface of the semiconductor substrate 1 in the earlier semiconductor integrated circuit will be described in detail. The area of the parasitic p-n-p bipolar transistor 29 generated in the vertical direction of the substrate is large and the area of the current path from the second well region 3 to the bottom surface of the semiconductor substrate 1 is also large. Therefore, a large amount of current flows to the current path in the earlier semiconductor integrated circuit.

Next, in the earlier semiconductor integrated circuit, the reason why the potential relationship of:

$$VB\text{-potential} < (VS\text{-potential} - 0.6 \text{ [V]})$$

is satisfied will be described in detail. As illustrated in FIG. 1, when the power converter 50 is driven in the semiconductor integrated circuit 40, for example, the bootstrap capacitor 56 which is an external element is connected between the VB-terminal 44 and the VS-terminal 43. The potential difference between the VB-potential applied to the VB-terminal 44 and the VS-potential applied to the VS-terminal 43—the voltage between VB and VS—is held by charge stored in the bootstrap capacitor 56. For example, the bootstrap diode 55 and other wires are connected to the VB-terminal 44. The load 57 and other wires are connected to the VS-terminal 43.

Because different circuits are connected to the VB-terminal 44 and the VS-terminal 43 and different types of parasitic capacitance are added to the VB-terminal 44 and the VS-terminal 43, in some cases, when the VB-potential varies, the VB-potential cannot follow sufficiently the variation of the VS-potential. As a result, when the VB-potential is changed by a negative voltage surge, it may be difficult to support the potential difference between the VB-potential and the VS-potential at a predetermined value. Therefore, when the difference between a variation in the VB-potential and a variation in the VS-potential is large, $$VB\text{-potential}<(VS\text{-potential}-0.6\ [V])$$

is satisfied in the earlier semiconductor integrated circuit.

In contrast, as illustrated in FIG. 3, because the semiconductor integrated circuit 40 according to the first embodiment of the present invention includes the current suppression layer 21, which is provided in the lower part of the semiconductor substrate 1 immediately below the first well region 2, being separated from the first well region 2, a potential barrier is generated in the current path of the parasitic p-n-p bipolar transistor 29 along the vertical direction of the substrate. The current path along the vertical direction of the substrate is defined between the second well region 3 and the bottom surface of the semiconductor substrate 1. By the existence of the current suppression layer 21, the collector of the parasitic p-n-p bipolar transistor 29 is not directly connected to the bottom surface of the semiconductor substrate 1. Therefore, suppression of the flow of a current through the current path along the vertical direction of the substrate, that is, the suppression of the movement of carriers is possible. Therefore, by reducing a current amplification factor $H_{FE}$ of the parasitic p-n-p bipolar transistor 29, the suppression of the operation of the parasitic p-n-p bipolar transistor 29 is possible. As a result, the occurrence of an operation error or an operation failure in the semiconductor integrated circuit 40 ascribable to the generation of heat by the flow of a large amount of current, which is caused by the operation of the parasitic p-n-p bipolar transistor 29, can be prevented. And thus, it is possible to improve the reliability of the semiconductor integrated circuit according to the first embodiment.

Figure 4:
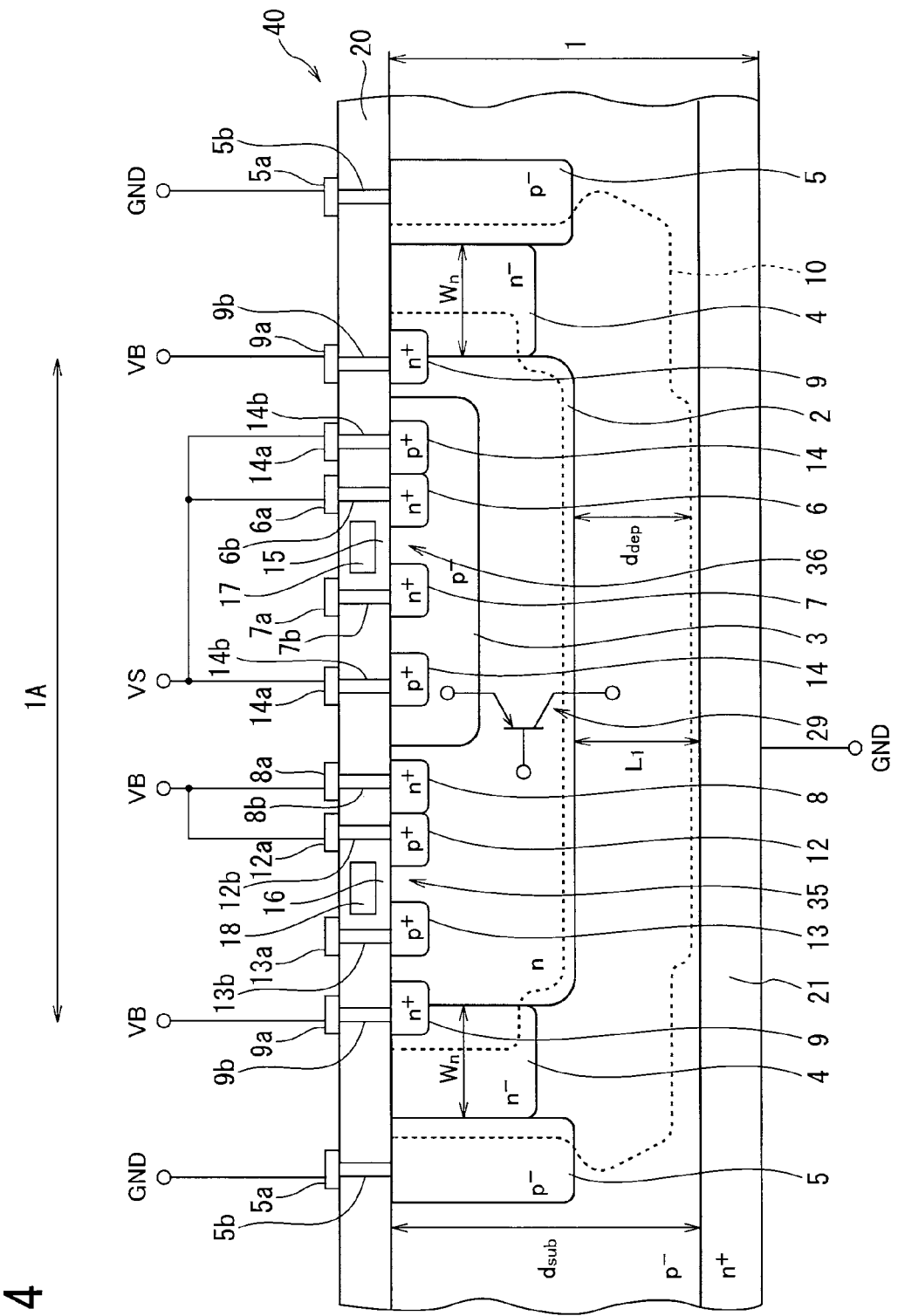
FIG. 4 is a cross-sectional view illustrating a main portion of the spreading of a depletion layer in the semiconductor integrated circuit according to the first embodiment of the present invention.

During the normal operation of the semiconductor integrated circuit 40, as illustrated in FIG. 4, a depletion layer 10 is generated in the p-n junction interface between the p⁻-type semiconductor substrate 1 and the p⁻-type isolation region 5, and the n-type first well region 2 and the n⁻ breakdown-voltage improving-region 4. When the depletion layer 10 comes into contact with the current suppression layer 21, the breakdown voltage is reduced. Therefore, in the semiconductor integrated circuit 40 according to the first embodiment, the thickness $d_{sub}$ of the semiconductor substrate 1 is set to a value at which the depletion layer 10 does not come into contact with the current suppression layer 21, that is, the depletion layer 10 is separated from the current suppression layer 21.

Figure 5:
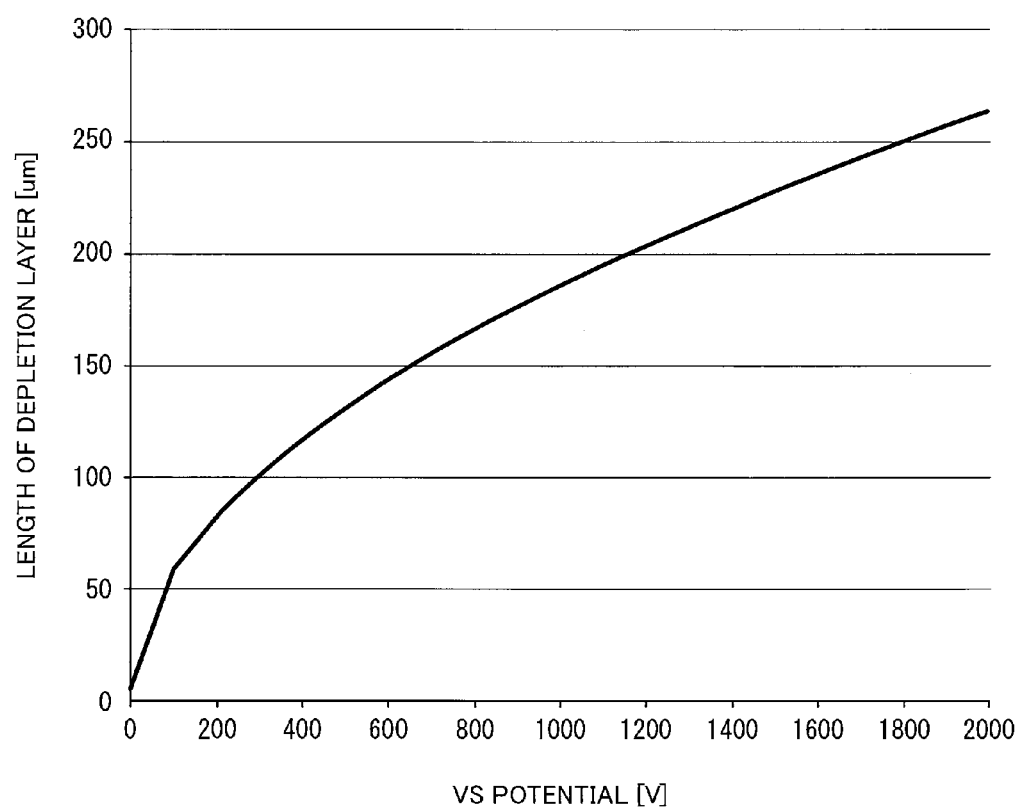
FIG. 5 is a diagram illustrating an example of the simulation result of the depletion layer in the semiconductor integrated circuit according to the first embodiment of the present invention.

FIG. 5 is a diagram illustrating an example of the simulation result of the depletion layer in the semiconductor integrated circuit 40 according to the first embodiment. FIG. 5 illustrates data for the length $d_{dep}$ of the depletion layer which is spread or extends from the p-n junction interface between the first well region 2 and the semiconductor substrate 1 to the semiconductor substrate 1 when potential is applied such that the p-n junction interface between the first well region 2 and the semiconductor substrate 1, which are illustrated in FIG. 4, is biased in the reverse direction. In the calculation of the data, the specific resistivity of the semiconductor substrate 1 is, for example, 350 Ωcm and the impurity concentration of the first well region 2 is, for example, $2 \times 10^{16}$ cm³.

In the semiconductor integrated circuit 40, the breakdown voltage is mainly 600 V and 1200 V. As illustrated in FIG. 5, the length $d_{dep}$ of the depletion layer 10 is about 150 μm when the VS-potential is 600 V and is about 200 μm when the VS-potential is 1200 V. The depth of the current suppression layer 21 is from about 0.5 μm to about 20 μm. The depth of the first well region 2 is about 10 μm. The thickness $d_{sub}$ from the top surface of the semiconductor substrate 1 to the current suppression layer 21 is set such that the depletion layer 10 is separated from the current suppression layer 21, considering the depth of the first well region 2. When the breakdown voltage is 600 V, the thickness $d_{sub}$ of the semiconductor substrate 1 is preferably equal to or greater than about 160 μm. When the breakdown voltage is 1200 V, the thickness $d_{sub}$ of the semiconductor substrate 1 is preferably equal to or greater than 210 μm.

In other words, a distance $L_1$ between the bottom of the first well region 2 and the current suppression layer 21 is preferably equal to or greater than about 150 μm if the rated breakdown voltage is designed to be 600 V, and is preferably equal to or greater than about 200 μm when the rated breakdown voltage is designed to be 1200 V.

When the VB-potential is lower than the VS-potential by 0.6 V or more due to a negative voltage surge, the collector current of the parasitic p-n-p bipolar transistor 29 flows through a current path from the bottom of the first well region 2 to the isolation region 5 through the semiconductor substrate 1 and flows to the ground electrode 5a to which the GND potential is applied. The width $W_n$ of the breakdown-voltage improving-region 4 between the first well region 2 and the isolation region 5 is increased to increase a resistance component of the current path. Therefore, reducing the current amplification factor $H_{FE}$ of the parasitic p-n-p bipolar transistor 29 and suppressing the operation of the parasitic p-n-p bipolar transistor are possible. In general, in order to ensure the predetermined breakdown voltage, the width $W_n$ of the breakdown-voltage improving-region 4 is about 100 μm when the breakdown voltage is 600 V and is about 200 μm when the breakdown voltage is 1200 V. When the width $W_n$ of the breakdown-voltage improving-region 4 is the above-mentioned value, the resistance component of the current path from the bottom of the first well region 2 to the breakdown-voltage improving-region 4 through the semiconductor substrate 1 increases and a large amount of collector current of the parasitic p-n-p bipolar transistor 29 does not flow to the ground electrode 5a.

In the first embodiment, the current suppression layer 21 is provided at the entire bottom surface of the semiconductor substrate 1. However, the current suppression layer 21 may be selectively provided at the bottom surface of the semiconductor substrate 1 so as to face at least the first well region 2.

Second Embodiment

A semiconductor integrated circuit 40A according to a second embodiment of the present invention has substantially the same structure as the semiconductor integrated circuit 40 according to the first embodiment except for the structure of a semiconductor substrate.

Figure 7:
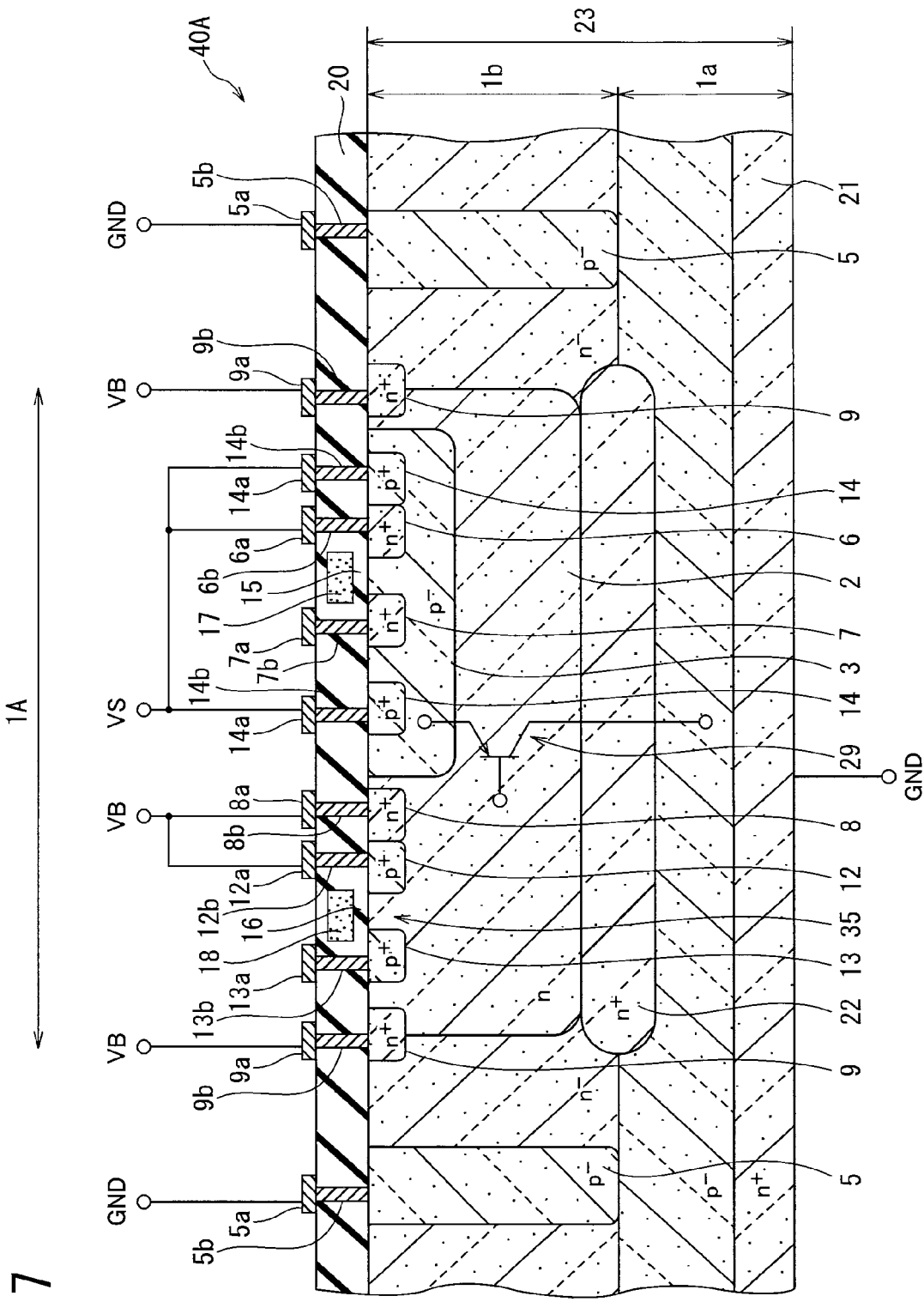
FIG. 7 is a cross-sectional view illustrating a main portion of the cross-sectional structure of a semiconductor integrated circuit according to a second embodiment of the present invention.

That is, the semiconductor integrated circuit 40 according to the first embodiment uses the p⁻-type semiconductor substrate 1 as illustrated in FIG. 3. In contrast, the semiconductor integrated circuit 40A according to the second embodiment uses a semiconductor substrate 23 in which a semiconductor active-layer 1b of a first conductivity type (n⁻-type) is provided on a semiconductor substrate 1a of a second conductivity type (p⁻-type) as illustrated in FIG. 7. For example, the semiconductor active-layer 1b may be an epitaxial-layer of the first conductivity type grown on the semiconductor substrate 1a. In a high-side driving-circuit forming-region 1A of the semiconductor substrate 23, a buried region 22 of the first conductivity type (n⁺-type) which has a higher impurity concentration than the semiconductor substrate 1a and the semiconductor active-layer 1b is provided between the semiconductor substrate 1a and the semiconductor active-layer 1b.

A first well region 2 and an isolation region 5 are merged in the semiconductor active-layer 1b. The first well region 2 is provided on the buried region 22 in the semiconductor active-layer 1b so as to come into contact with the buried region 22. The isolation region 5 is provided with a depth that reaches the semiconductor substrate 1a. In addition, a current suppression layer 21 is provided in a lower part of the semiconductor substrate 1a immediately below the first well region 2 so as to be separated from the first well region 2 and the buried region 22. In the first embodiment, as illustrated in FIG. 3, the breakdown-voltage improving-region 4 is provided between the first well region 2 and the isolation region 5. However, in the second embodiment, as illustrated in FIG. 7, instead of the breakdown-voltage improving-region 4 illustrated in FIG. 3, the semiconductor active-layer 1b is provided between the first well region 2 and the isolation region 5. Therefore, an n⁺ third contact region 9 is provided in the upper parts of the first well region 2 and the semiconductor active-layer 1b so as to bridge the first well region 2 and the semiconductor active-layer 1b. The other structures are the same as those in the first embodiment.

The semiconductor integrated circuit 40A according to the second embodiment includes the high-concentration buried region 22 which is provided between the semiconductor substrate 1a and the semiconductor active-layer 1b so as to come into contact with the first well region 2 in the high-side driving-circuit forming-region 1A. Therefore, because the base concentration of a parasitic p-n-p bipolar transistor 29 can be made high, the reduction of the current amplification factor $H_{FE}$ of the parasitic p-n-p bipolar transistor 29 is possible. As a result, the suppression of the operation of the parasitic p-n-p bipolar transistor 29 is possible.

Similarly to the first embodiment, the semiconductor integrated circuit 40A according to the second embodiment includes the current suppression layer 21 which is provided in the lower part of the semiconductor substrate 1a immediately below the first well region 2 so as to be separated from the first well region 2 and the buried region 22 in the high-side driving-circuit forming-region 1A. Therefore, similarly to the first embodiment, the suppression of the operation of the parasitic p-n-p bipolar transistor 29 is possible. As a result, in the semiconductor integrated circuit 40A according to the second embodiment, further, the suppression of the operation of the parasitic p-n-p bipolar transistor 29, as compared to the first embodiment is possible.

Third Embodiment

A semiconductor integrated circuit 40B according to a third embodiment of the present invention has substantially the same structure as the semiconductor integrated circuit 40A according to the second embodiment except for the structure of a semiconductor substrate.

Figure 8:
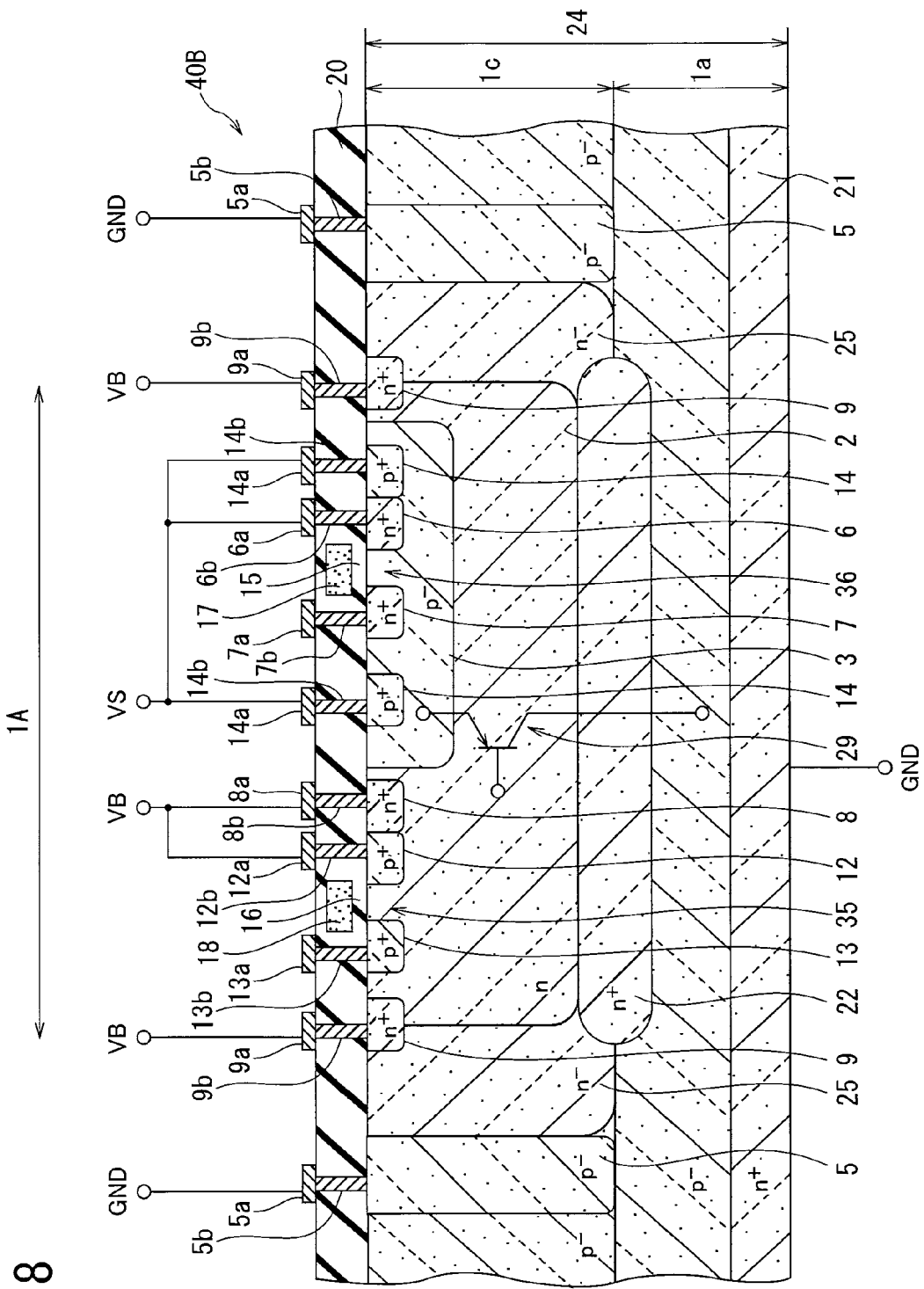
FIG. 8 is a cross-sectional view illustrating a main portion of the cross-sectional structure of a semiconductor integrated circuit according to a third embodiment of the present invention.

That is, the semiconductor integrated circuit 40A according to the second embodiment uses the semiconductor substrate 23 in which the n⁻-type semiconductor active-layer 1b is provided on the p⁻-type semiconductor substrate 1a, as illustrated in FIG. 7. In contrast, the semiconductor integrated circuit 40B according to the third embodiment uses a semiconductor substrate 24 in which a semiconductor active-layer 1c of a second conductivity type (p⁻-type) is provided on a semiconductor substrate 1a of the second conductivity type (p⁻-type), as illustrated in FIG. 8. In a high-side driving-circuit forming-region 1A of the semiconductor substrate 24, a buried region 22 of a first conductivity type (n⁺-type) which has a higher impurity concentration than the semiconductor substrate 1a and the semiconductor active-layer 1c is provided between the semiconductor substrate 1a and the semiconductor active-layer 1c.

In the semiconductor substrate 1a, an isolation region 5 is provided with a depth that reaches the semiconductor active-layer 1c. A third well region 25 of the first conductivity type (n⁻-type) is provided in the semiconductor active-layer 1c. A first well region 2 is provided in the third well region 25. In addition, the first well region 2 is provided on a buried region 22 in the third well region 25 so as to come into contact with the buried region 22. In the second embodiment, the semiconductor active-layer 1b is provided between the first well region 2 and the isolation region 5, as illustrated in FIG. 7. However, in the third embodiment, instead of the semiconductor active-layer 1b illustrated in FIG. 7, the third well region 25 is provided between the first well region 2 and the isolation region 5, as illustrated in FIG. 8. Therefore, an n⁺ third contact region 9 is provided in the upper parts of the first well region 2 and the third well region 25 so as to bridge the first well region 2 and the third well region 25. The other structures are the same as those in the second embodiment.

The semiconductor integrated circuit 40B according to the third embodiment includes the high-concentration buried region 22 which is provided between the semiconductor substrate 1a and the semiconductor active-layer 1c so as to come into contact with the first well region 2 in the high-side driving-circuit forming-region 1A. Therefore, the base concentration of a parasitic p-n-p bipolar transistor 29 is high and reducing the current amplification factor $H_{FE}$ of the parasitic p-n-p bipolar transistor 29 is possible. As a result, the suppression of the operation of the parasitic p-n-p bipolar transistor 29 is possible.

Similarly to the first embodiment, the semiconductor integrated circuit 40B according to the third embodiment includes a current suppression layer 21 which is provided in the lower part of the semiconductor substrate 1a immediately below the first well region 2 so as to be separated from the first well region 2 and the buried region 22 in the high-side driving-circuit forming-region 1A. Therefore, similarly to the first embodiment, the suppression of the operation of the parasitic p-n-p bipolar transistor 29 is possible. As a result, in the semiconductor integrated circuit 40B according to the third embodiment, further, the suppression of the operation of the parasitic p-n-p bipolar transistor 29, as compared to the first embodiment, similarly to the second embodiment is possible.

Fourth Embodiment

Figure 9:
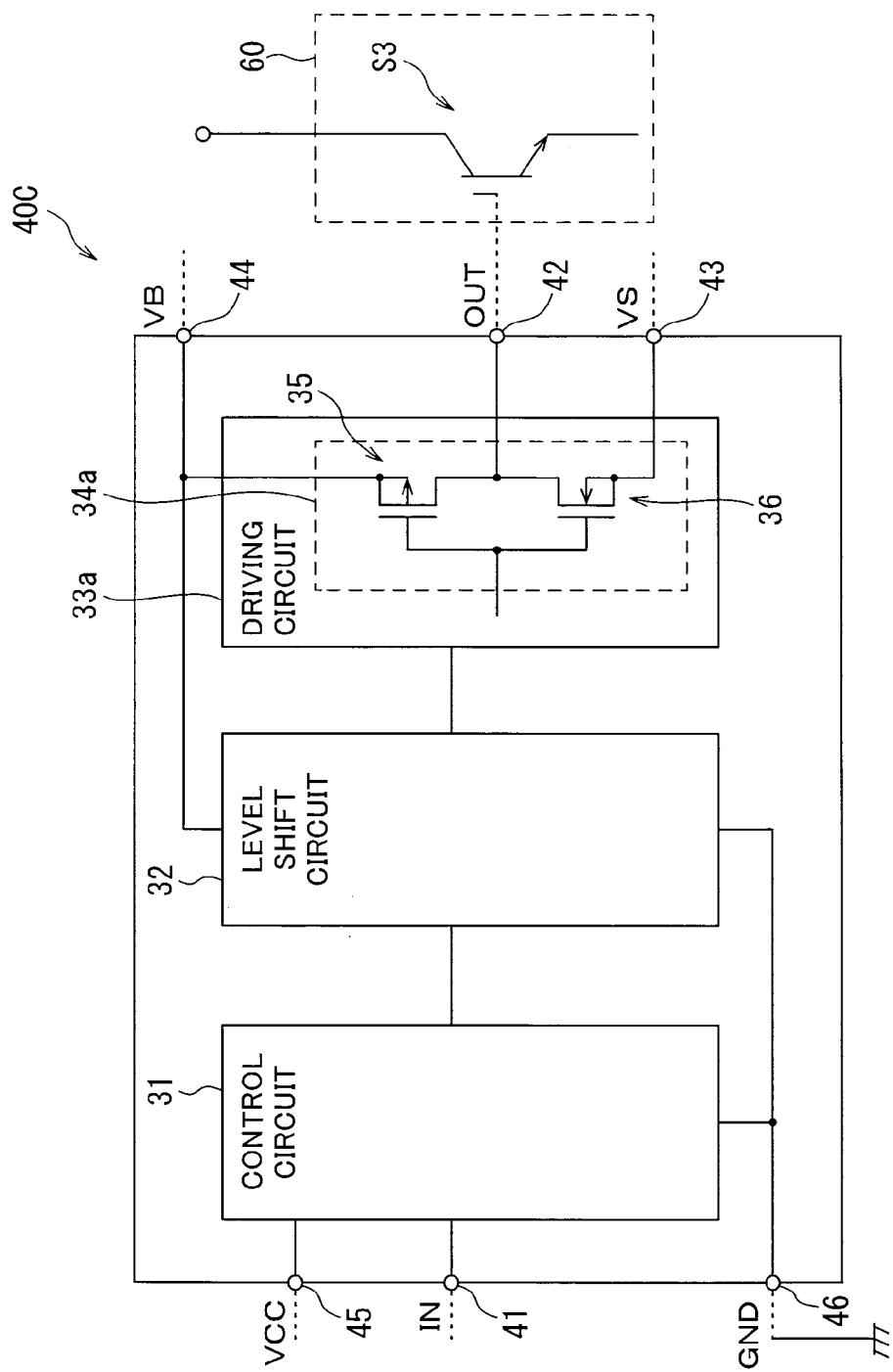
FIG. 9 is a circuit diagram schematically illustrating the structure of a semiconductor integrated circuit according to a fourth embodiment of the present invention.
Figure 10:
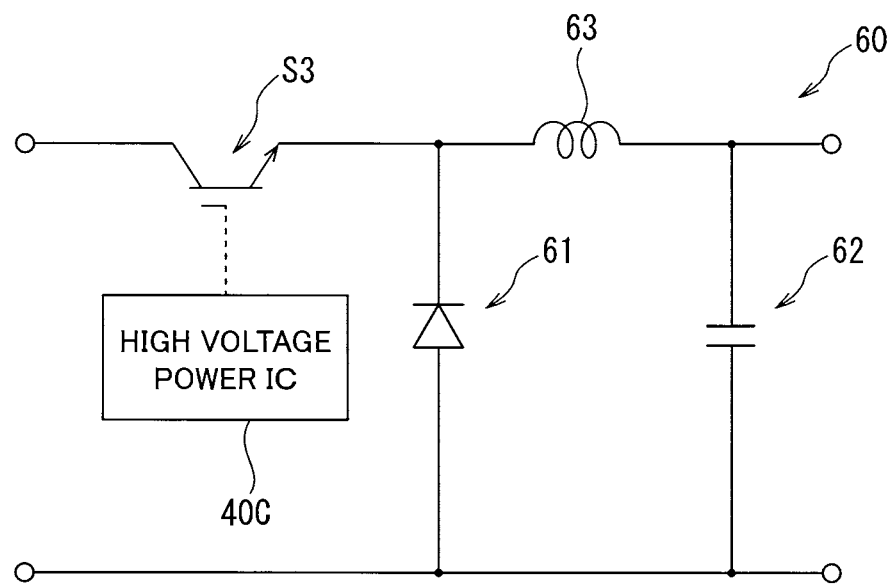
FIG. 10 is a circuit diagram schematically illustrating the structure of a step-down converter using the semiconductor integrated circuit according to the fourth embodiment of the present invention.

As illustrated in FIG. 9, a semiconductor integrated circuit 40C according to a fourth embodiment of the present invention is a power IC including, for example, a control circuit 31, a level shift circuit 32, and a driving circuit 33a. As illustrated in FIG. 9, the semiconductor integrated circuit 40C drives, for example, a switching element S3 of a step-down converter 60. As illustrated in FIG. 10, the step-down converter 60 includes, for example, a diode 61, a capacitor 62, a coil 63, and the switching element S3. The switching element S3 is an active element such as an IGBT.

The driving circuit 33a includes a gate driving circuit 34a. The gate driving circuit 34a has the same structure as the gate driving circuit 34 according to the first embodiment. Specifically, a source of a pMOS 35 is connected to a VB-terminal 44 and a drain of the pMOS 35 is connected to a drain of an nMOS 36. A source of the nMOS 36 is connected to a VS-terminal 43. A gate of the switching element S3 implementing the step-down converter 60 is connected to a connection point between the pMOS 35 and the nMOS 36.

The gate driving circuit 34a operates, using a VS-potential, which is applied as a second potential to the VS-terminal 43, as a reference potential and a VB-potential which is applied as a first potential to the VB-terminal 44, as a power-supply potential and transmits a driving signal from an output terminal 42 on the basis of a signal received from the level shift circuit 32 to drive the switching element S3 of the step-down converter 60.

When the semiconductor integrated circuit 40C according to the fourth embodiment which drives the switching element S3 of the step-down converter 60 is described with reference to FIG. 3, similarly to the first embodiment, the suppression of the operation of a parasitic p-n-p bipolar transistor 29 including a p$^-$-type second well region 3, an n$^-$-type first well region 2, and a p$^-$-type semiconductor substrate 1 is possible.

In the fourth embodiment, the semiconductor integrated circuit which drives the switching element S3 of the step-down converter 60 has been described. However, the invention is not limited to the aforementioned embodiments. For example, the invention can be applied to semiconductor integrated circuits for driving switching elements of a boost and step-down converter, a flyback converter, and a forward converter.

Other Embodiments

The present invention has been described above on the basis of the above-described embodiments. However, the invention is not limited to the above-described embodiments and various modifications and changes of the invention can be made without departing from the scope and spirit of the invention.

As described above, according to the semiconductor integrated circuit of the present invention, improving the reliability of the semiconductor integrated circuit is possible and the semiconductor integrated circuit according to the invention can be useful for a power integrated circuit device (for example, power IC) including a driving circuit which drives a switching element.

What is claimed is:

1. A semiconductor integrated circuit comprising:
    a first well region of a first conductivity type;
    a second well region of a second conductivity type provided in an upper part of the first well region;
    a current suppression layer of the first conductivity type provided in a lower part of a semiconductor substrate immediately below the first well region, separated from the first well region; and
    an isolation region of the second conductivity type provided in an upper part of the semiconductor substrate, separated from the first well region, a reference potential being applied to the isolation region,
    wherein the semiconductor substrate is the second conductivity type.

2. The semiconductor integrated circuit according to claim 1, wherein the first well region is provided in the upper part of the semiconductor substrate.

3. The semiconductor integrated circuit according to claim 1, further comprising:
    a buried region of the first conductivity type, being interposed between a semiconductor active-layer and the semiconductor substrate,
    wherein the first well region is provided on the buried region in an upper part of the semiconductor active-layer, being in contact with the buried region, and
    the current suppression layer is separated from the buried region.

4. The semiconductor integrated circuit according to claim 3, wherein
    the isolation region of the second conductivity type provided so as to extend from the upper part of the semiconductor active-layer to the semiconductor substrate, the reference potential being applied to the isolation region.

5. The semiconductor integrated circuit according to claim 4,
    wherein a first potential different from the reference potential is applied to the first well region, and
    a second potential different from the reference potential and the first potential is applied to the second well region.

6. The semiconductor integrated circuit according to claim 5,
    wherein a p-n junction interface between the first well region and the second well region is reversely biased by the first potential and the second potential during a normal operation.

7. The semiconductor integrated circuit according to claim 6, further comprising:
    a first active element having a first main electrode region and a second main electrode region of the second conductivity type provided in the upper part of the first well region; and
    a second active element having a first main electrode region and a second main electrode region of the first conductivity type provided in an upper part of the second well region.

8. The semiconductor integrated circuit according to claim 7, further comprising:

a gate driving circuit including the first active element and the second active element connected in series to each other, wherein a gate of a switching element driven by the gate driving circuit is connected to a connection point between the first active element and the second active element.

9. The semiconductor integrated circuit according to claim 8, wherein the second main electrode region of the first active element and the second main electrode region of the second active element are connected to each other, the first potential is applied to the first main electrode region of the first active element, and the second potential is applied to the first main electrode region of the second active element.

10. The semiconductor integrated circuit according to claim 7, further comprising:

a gate driving circuit including the first active element and the second active element connected in series to each other, wherein, when a high-side circuit including a high-voltage-side switching element and a low-voltage-side switching element connected in series to each other is driven by the gate driving circuit, a gate of the high-voltage-side switching element is connected to a connection point between the first active element and the second active element.

11. The semiconductor integrated circuit according to claim 10, wherein the second main electrode region of the first active element and the second main electrode region of the second active element are connected to each other, the first potential is applied to the first main electrode region of the first active element, and the second potential is applied to the first main electrode region of the second active element.

12. The semiconductor integrated circuit according to claim 1, wherein a first potential different from the reference potential is applied to the first well region, and a second potential different from the reference potential and the first potential is applied to the second well region.

13. The semiconductor integrated circuit according to claim 1, wherein a distance between the first well region and the current suppression layer is set to a value at which a depletion layer being spread from a p-n junction interface between the semiconductor substrate and the first well region is separated from the current suppression layer when a first potential is applied to the first well region and a second potential different from the first potential is applied to the second well region.

14. The semiconductor integrated circuit according to claim 13, further comprising:

a first active element having a first main electrode region and a second main electrode region of the second conductivity type provided in the upper part of the first well region; and a second active element having a first main electrode region and a second main electrode region of the first conductivity type provided in an upper part of the second well region.

15. The semiconductor integrated circuit according to claim 14, further comprising:

a gate driving circuit including the first active element and the second active element connected in series to each other, wherein a gate of a switching element driven by the gate driving circuit is connected to a connection point between the first active element and the second active element.

16. The semiconductor integrated circuit according to claim 15, wherein the second main electrode region of the first active element and the second main electrode region of the second active element are connected to each other, the first potential is applied to the first main electrode region of the first active element, and the second potential is applied to the first main electrode region of the second active element.

17. The semiconductor integrated circuit according to claim 14, further comprising:

a gate driving circuit including the first active element and the second active element connected in series to each other, wherein, when a high-side circuit including a high-voltage-side switching element and a low-voltage-side switching element connected in series to each other is driven by the gate driving circuit, a gate of the high-voltage-side switching element is connected to a connection point between the first active element and the second active element.

18. The semiconductor integrated circuit according to claim 17, wherein the second main electrode region of the first active element and the second main electrode region of the second active element are connected to each other, the first potential is applied to the first main electrode region of the first active element, and the second potential is applied to the first main electrode region of the second active element.

* * * * *